(12) United States Patent
Matsunaga et al.

(10) Patent No.: US 7,665,205 B2
(45) Date of Patent: Feb. 23, 2010

(54) METHOD OF MANUFACTURING A LAMINATED LEADFRAME

(75) Inventors: Kiyoshi Matsunaga, Fukuoka (JP); Chikaya Mimura, Fukuoka (JP); Takao Shioyama, Fukuoka (JP)

(73) Assignee: Mitsui High-Tec, Inc. (JP)

( * ) Notice: Subject to any disclaimer, the term of this patent is extended or adjusted under 35 U.S.C. 154(b) by 0 days.

(21) Appl. No.: 11/595,757

(22) Filed: Nov. 9, 2006

(65) Prior Publication Data

US 2007/0119050 A1 May 31, 2007

(30) Foreign Application Priority Data

Nov. 11, 2005 (JP) ............................. 2005-327631
Nov. 16, 2005 (JP) ............................. 2005-331937

(51) Int. Cl.
*H01R 43/00* (2006.01)
*H01L 21/00* (2006.01)

(52) U.S. Cl. ............................. 29/825; 29/827; 29/830; 438/109; 438/110; 438/111

(58) Field of Classification Search ................ 29/825, 29/830, 827; 438/109, 110, 111
See application file for complete search history.

(56) References Cited

U.S. PATENT DOCUMENTS 6,320,251 B1 * 11/2001 Glenn ..................... 257/678
6,383,840 B1 * 5/2002 Hashimoto ................ 438/109
6,667,544 B1 * 12/2003 Glenn ..................... 257/686
2004/0014257 A1 * 1/2004 Kim et al. ................ 438/111

FOREIGN PATENT DOCUMENTS

| JP | 5-152480 A | 6/1993 |
| JP | 7-13227 | 3/1995 |
| JP | 2001-35987 | 2/2001 |
| JP | 2001-274310 | 10/2001 |
| JP | 2002-280511 A | 9/2002 |
| JP | 2003-7955 | 1/2003 |
| JP | 2004-031650 A | 1/2004 |
| JP | 2004-056138 A | 2/2004 |

* cited by examiner

*Primary Examiner*—C. J Arbes
(74) *Attorney, Agent, or Firm*—Wood, Phillips, Katz, Clark & Mortimer

(57) ABSTRACT

Disclosed are a method for manufacturing a laminated lead frame and a laminated lead frame manufactured thereby, wherein lead frame single plates to be laminated one on top of the other can be reliably bonded together with a relatively light load. Under the method for manufacturing a laminated lead frame by means of stacking and bonding lead frame single plates 10 and 11, each of which has been processed into a predetermined shape, a plurality of protuberance sections 12 are formed in at least one of mutually-opposing surfaces of the lead frame single plates 10 and 11 that vertically pair up with each other. The mutually-opposing lead frame single plates 11, 12 are bonded together via the protuberance sections 12.

8 Claims, 15 Drawing Sheets

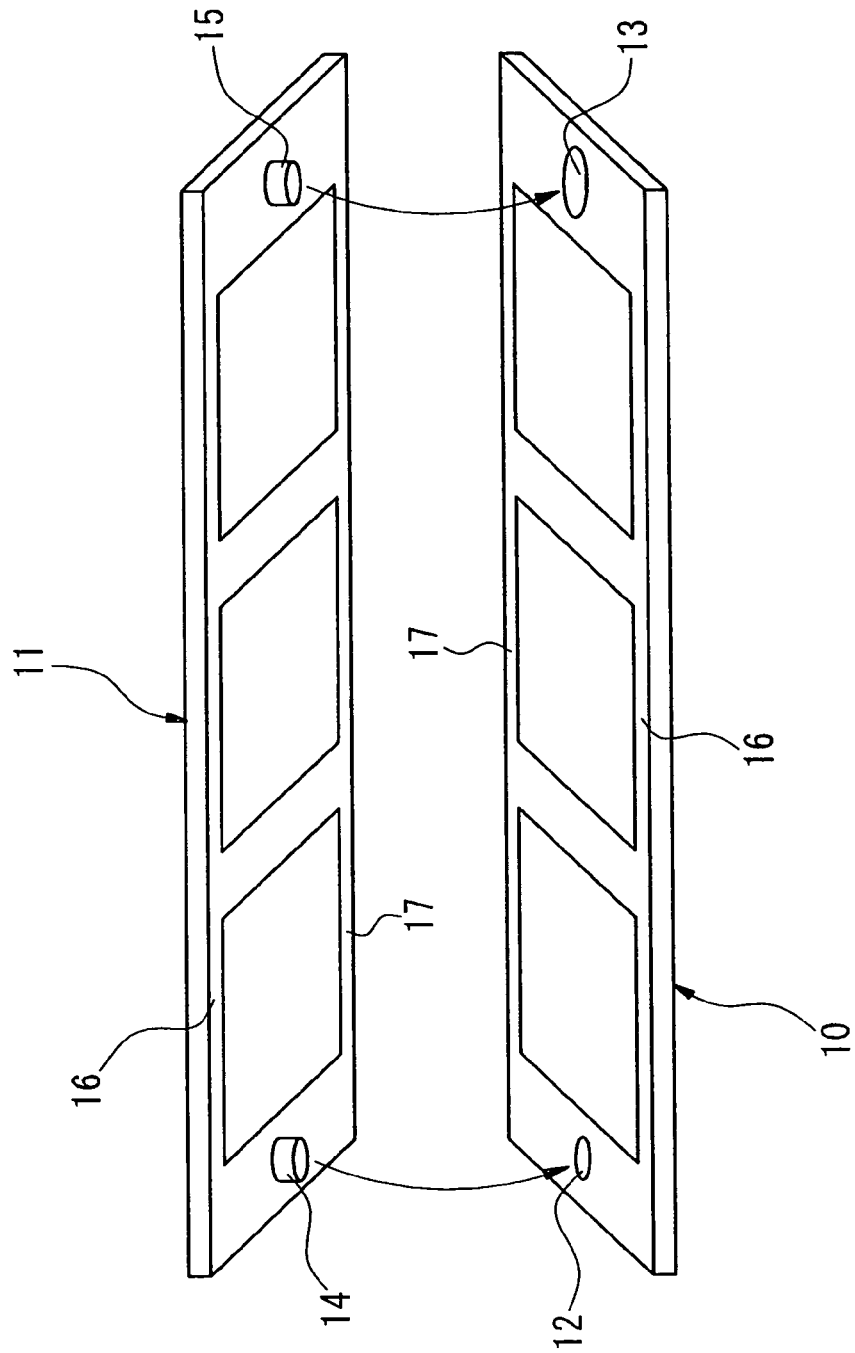

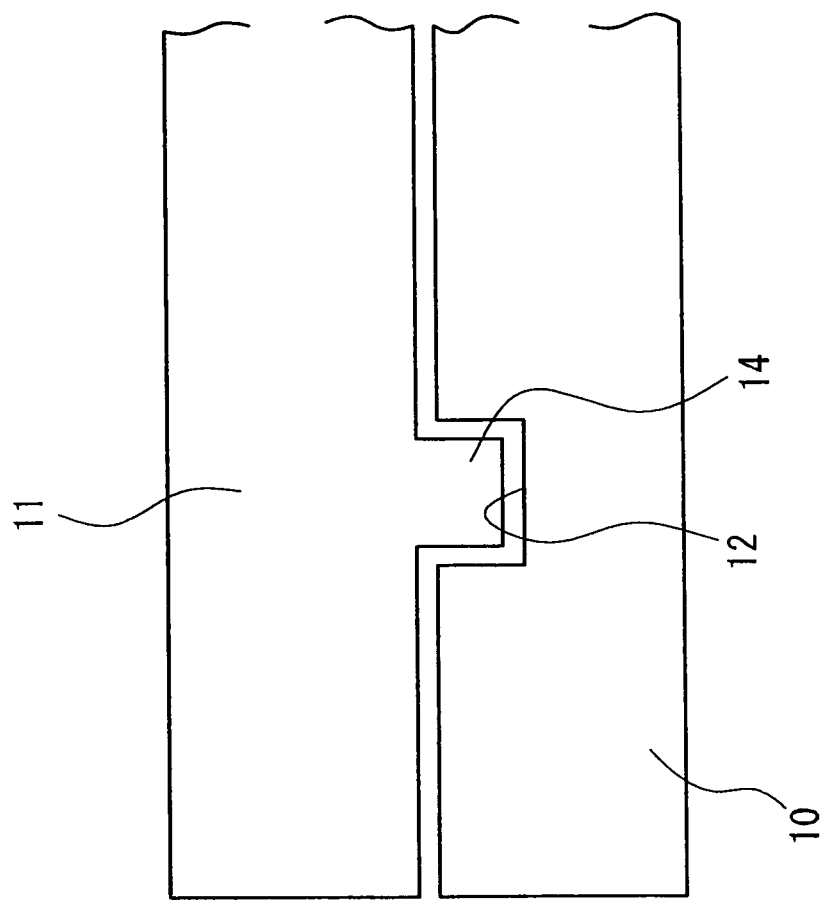

METHOD OF MANUFACTURING A LAMINATED LEADFRAME

BACKGROUND OF THE INVENTION

The present invention relates to a laminated lead frame used for a semiconductor device, such as an IC, and more particularly to a laminated lead frame formed by laminating a plurality of thin plates and to a method for manufacturing the same.

In the field of QFN (Quad Flat Non-leaded) semiconductor devices, SON (Small Outline Non-leaded) semiconductor devices, and the like, a reduction in the pitch of leads (inner leads) has been pursued with an aim of achieving a reduction in thickness. There is a trend toward a further reduction in the thickness of a lead frame. However, when the thickness of the lead frame is reduced, the lead frame is prone to buckling during a transport process or a subsequent assembly process, to thus induce a failure, which is in turn responsible for a reduction in productivity.

In a related-art QFN semiconductor device or a related-art SON semiconductor device, only external contact terminals are exposed outside a sealing resin section of a package, and other areas of the device are covered with sealing resin. Eventually, an increase arises in the thickness of resin in only this area, thereby hindering a reduction in the thickness of a package. For this reason, there has been known a laminated lead frame, wherein two lead frames of different shapes are laminated in an attempt to reduce the size and thickness of an IC package while the strength of the lead frame is maintained, thereby forming a single laminated lead frame (see e.g., Patent Document 1). In addition, a package (see, e.g., Patent Document 2) using a lead frame—whose thickness corresponds to the thickness of a package and which has an L-shaped cross-sectional profile—has hitherto been known.

These laminated lead frames are created by a technique of bonding together a plurality of lead frame single plates (referring to individual lead frame materials to be bonded), thereby rendering a pitch of a lead frame fine and enabling materialization of a lead frame of three-dimensional profile. A diffusion bonding method is primarily used for bonding lead frame single plates together, wherein an appropriate load and heat are applied to the laminated lead frame single plates from a thickness wise direction thereof.

Under the diffusion bonding method, as a result of application of a load to materials (lead frame single plates) remaining in a laminated state, mutually-facing interfaces of the materials move closer to each other. When the materials are heated in this state, atomic energy in the materials becomes active, thereby initiating migration (diffusion) of atoms between the materials adjoining to each other with the interfaces interposed therebetween. When diffusion of atoms proceeds, atoms of the two materials are mingled together to such an extent that the presence of the interfaces becomes uncertain, whereby the materials are bonded together.

According to the diffusion bonding method, approach (deformation) of the interfaces achieved by application of a load generally becomes more likely to arise at a higher temperature, thereby facilitating a progress in diffusion and enhancing a bonding characteristic.

However, when the diffusion bonding method is adopted in manufacture of a laminated lead frame, diffusion bonding is realized by means of applying a heavy load of an order which limits plastic deformation (a reduction in thickness) of a lead frame single plate to one percent or less (namely, when bonding load is increased, waviness or irregularities existing in the interface are mechanically squeezed, thereby enabling a reduction in a distance between atoms of upper and lower lead frame single plates), because diffusion bonding is desired to be performed at as low a temperature as possible (a temperature used for assembling an IC; e.g., 260° C. or less).

The surface of a lead frame single plate is plated as an inserted material to a thickness of the order of 3 to 5 micrometers with Ag or Au which has a low fusing point and exhibits high diffusion with respect to a material (Cu or Fe—Ni) of the lead frame single plate. As a result, an attempt is made to reduce the bonding temperature and load.

Moreover, there has been proposed a laminated lead frame formed by laminating a lower lead frame and an upper lead frame (see, e.g., Patent Document 3). By means of the laminated lead frame, the number of outer leads is increased, and an increase in the width of a plastic sealing body even in the semiconductor device can be avoided to the extent possible.

Moreover, a semiconductor device using a laminated lead frame is also proposed (see, e.g., Patent Document 4).

[Patent Document 1] JP-UM-B-7-13227
[Patent Document 2] JP-A-2003-7955
[Patent Document 3] JP-A-2001-035987
[Patent Document 4] JP-A-2001-274310

According to the technique described in Patent Document 1, in order to achieve success in bonding together lead frame single plates at the lowest possible temperature and under the lowest possible load, surface roughness and flatness of planes of both lead frame single plates to be bonded together must have been increased so that the two materials can make contact with each other in an early stage.

For instance, as shown in FIG. 14, when a terminal lead 60 of an upper lead frame single plate and an inner lead 61 of a lower lead frame single plate must be bonded together, the entire leads 60 and 61 are, at present, brought into contact with each other and bonded together. According to this method, an area where the leads 60 and 61 are bonded together is wide, and hence difficulty is encountered in maintaining the flatness of the surfaces of the leads 60 and 61. In FIG. 14, reference numeral 62 denotes a bond portion.

Particularly, variations in the thickness of the Ag-plating or the thickness of the Au-plating, both elements being used as an insert material, range from about 1 to 2 micrometers, and there is a characteristic of the element being deposited to a large thickness at the end of the lead. Hence, as shown in FIG. 15, when lead frame single plates are stacked together, a clearance 63 arises in the center of the leads 60, 61. Accordingly, when the leads are bonded together in this state, an unbonded portion remains, which poses difficulty in assuring perfect bonding over the entire surface. In order to bring the interfaces into contact with each other by collapse of the clearance and to achieve success in bonding the interfaces, a much heavier load is required. Consequently, plastic deformation (a decreased thickness) leads to occurrence of a failure in the shape of the lead frame, and a large press machine used for generating a heavy load is required.

Under the method described in Patent Document 3, when a single laminated lead frame is formed by overlapping, one on top of the other, at least two lead frame single plates, which have been processed into a predetermined shape in advance (corresponding to single lead frame materials before being superimposed or stacked together), registration of upper and lower lead frame single plates is considerably laborious. Pilot holes are generally formed in both sides of a bar used for manufacturing a lead frame single plate.

In relation to bonding of the upper and lower lead frame single plates, the upper and lower lead frame single plates are placed in a bonding mold, and the single plates are positioned by means of formed pilot holes and pilot pins. After the upper and lower lead frame single plates have been positioned, the plates are heated and pressurized within the bonding mold, thereby completing a laminated lead frame into which the upper and lower lead frame single plates are bonded together.

As mentioned above, the bonding mold requires pilot pins used for positioning each of the lead frame single plates, and a plurality of bonding molds must be prepared according to the type of a lead frame single plate. During the course of manufacture of a lead frame single plate, pilot holes acquired after bonding are narrowed by minute misregistration, or the like, of the lead frame single plates, and galling arises in the pins, which in turn poses difficulty in removal of a laminated lead frame. This is responsible for deformation of a laminated lead frame or defects.

Occasionally, there also arises a case where specifications provided by the client pose difficulty in forming pilot holes at required positions on side rails of a laminated lead frame because of restrictions, such as difficulty in transporting a laminated lead frame by use of, e.g., a suction pad.

Moreover, when the lead frame single plates and a completed laminated lead frame are subjected to registration by use of the pilot holes, accuracy is required in connection with the positions of the pilot pins, a pitch between pilot pins of adjacent lead frames (or unit lead frames), the outer shape of a lead frame single plate, and the like, which leads to an increase in required quality or accuracy of jigs, and the like, and an accompanying cost hike.

SUMMARY OF THE INVENTION

The present invention has been conceived against the backdrop and aims at providing a method for manufacturing a laminated lead frame which enables reliable bonding of respective lead frame single plates to be stacked at a comparatively-small load, as well as providing a laminated lead frame.

The present invention also aims at providing a method for manufacturing a laminated lead frame which facilitates superimposition of at least two lead frame single plates and enables cutting of production cost and manufacture of a laminated lead frame without formation of pilot holes in side rails of a completed lead frame, as well as providing a laminated lead frame manufactured by the method.

A method for manufacturing a laminated lead frame according to a first invention serving the above purpose corresponds to a method for manufacturing a laminated lead frame by means of stacking together a plurality of lead frame single plates, each of which is processed into a predetermined shape, the method comprising:

forming a plurality of protuberances in at least one of mutually-opposing faces of upper and lower lead frame single plates forming a pair; and stacking the mutually-opposing lead frame single plates together with the protuberances interposed therebetween.

A method for manufacturing a laminated lead frame according to a second invention corresponds to a method for manufacturing a laminated lead frame by means of stacking and bonding together a plurality of lead frame single plates, each of which is processed into a predetermined shape, the method comprising:

forming a plurality of protuberances in at least one of mutually-opposing faces of upper and lower lead frame single plates forming a pair; and bonding the mutually-opposing lead frame single plates together with the protuberances interposed therebetween.

According to a method for manufacturing a laminated lead frame of a third invention, in the method for manufacturing a laminated lead frame of the second invention, the protuberances are formed by any one of half-etching, coining, and thick plating.

According to a method for manufacturing a laminated lead frame of a fourth invention, in the method for manufacturing a laminated lead frame of the second invention, surfaces of the protuberances and at least areas, which are brought into contact with the protuberances, in the counterpart lead frame single plate to be bonded with the protuberances are plated with rare metal.

Here, plating of rare metal means deposition of Au, Ag, Pt, Pd, or the like. Undercoating can naturally be performed for deposition of rare metal.

According to a method for manufacturing a laminated lead frame according to a fifth invention, in the method for manufacturing a laminated lead frame of the fourth invention, bonding of the lead frame single plate is performed by application of pressure, which enables collapse of extremities of the protuberances, while the lead frame single plates are heated at 180° C. to 300° C. As a result, diffusion and bonding of the protuberances can be performed in an essentially perfect manner, and uniform bonding can be performed by means of collapsing the extremities of the protuberances at a comparatively small load even when the protuberances differ in height from each other.

A laminated lead frame of a sixth invention is manufactured by use of any of the second to fifth methods. Accordingly, there is provided a stronger laminated lead frame into which respective lead frame single plates are reliably bonded together.

A method for manufacturing a laminated lead frame according to a seventh invention comprises:

a first step of forming a plurality of sets of recess and protuberances, which are formed by means of half-etching or half-die cutting and form pairs, at corresponding positions of at least two lead frame single plates;

a second step of fitting the protuberances into the recesses, thereby superimposing the lead frame single plates one on top of the other; and a third step of bonding the superimposed lead frame single plates by means of heating and pressurization.

According to a method for manufacturing a laminated lead frame of an eighth invention, in the method for manufacturing a laminated lead frame of the seventh invention, in the second step the lead frame single plates are caulked and coupled together by means of the recesses and the protuberances.

According to a method for manufacturing a laminated lead frame of a ninth invention, in the method for manufacturing a laminated lead frame of the seventh invention, of the recesses and the protuberances formed in a plurality of sets, the recess and the protuberance of one set are used as a reference for the lead frame single plates to be superimposed; and, of the recess and the protuberance of another set, the recess becomes an elongated hole in a direction of the maximum elongation of the lead frame single plate.

According to a method for manufacturing a laminated lead frame of a tenth invention, in the method for manufacturing a laminated lead frame of the second invention, surfaces of at least bond faces of the lead frame single plates are plated with rare metal.

According to a method for manufacturing a laminated lead frame of an eleventh invention, in the method for manufacturing a laminated lead frame of the seventh invention, pilot holes into which registration pilot pins are to be fitted are formed at corresponding locations on the respective lead frame single plates.

According to a method for manufacturing a laminated lead frame of a twelfth invention, in the method for manufacturing a laminated lead frame of the eleventh invention, pilot holes formed in the lead frame single plate superimposed on the lead frame single plate to become a reference are larger in diameter than pilot holes formed in the lead frame single plate to become a reference.

A laminated lead frame of a thirteenth invention is manufactured under the method for manufacturing a laminated lead frame of the seventh inventions.

According to a laminated lead frame according to a fourteenth invention, in the laminated lead frame according to the thirteenth invention, the recesses and the protuberances are formed by half-blanking caulking, and in the third step the recesses and the protuberances are not exposed from front and back surfaces of the laminated lead frame bonded.

According to the method for manufacturing a laminated lead frame and a laminated lead frame manufactured thereby, both of which pertain to the present invention, lead frame single plates to be superimposed one on top of the other are bonded together by use of protuberances. Accordingly, as a result of a decrease in bond areas, an load required for bonding can be reduced. By virtue of this reduction, the size of equipment can be made small, by means of reducing equipment capability.

Contacting a bond surface is facilitated by means of limiting the range of bonding. Moreover, since flatness can be readily acquired, the chance of a bonding failure (occurrence of an unbonded area) can be reduced.

When unevenness exists in the heights of the protuberances for reasons of variations in the thickness of a lead frame single plate and plating, the protuberances are slightly collapsed by means of increasing a load, thereby absorbing variations in the height of the variations. Thus, occurrence of an unbonded area can be prevented.

According to the method for manufacturing a laminated lead frame and a laminated lead frame manufactured thereby, both of which pertain to the present invention, the lead frame single plates to be stacked are coupled together by means of the recesses and the protuberances before being subjected to heating and pressurization. Hence, subsequent processing is facilitated. For example, even when the superimposed lead frame single plates are fastened together by means of subjecting the superimposed lead frame single plates to pressurization and heating, a flat plate can be used as a heat plate. Therefore, the necessity for accurate registration or use of a precise bonding mold is obviated. Further, upper and lower lead frame single plates can also be heated and pressurized by use of a jig such as that used in roll welding.

Particularly, when recesses and protuberances are formed by means of half-etching, irregularities are eliminated from the front and back surfaces of the laminated lead frame, and subsequent transport processing using a suction pad and the like is facilitated.

BRIEF DESCRIPTION OF THE DRAWINGS

FIG. 7 is a perspective view for describing a method for manufacturing a laminated lead frame according to a second embodiment of the present invention;

FIG. 8 is a partially-detailed descriptive view of the method;

10, 11: LEADS, 12: PROTUBERANCE, 13, 14: Ag-PLATING (PLATING OF RARE METAL), 15: PROTUBERANCE, 16: LEAD, 16a: Ag-PLATING, 17: LEAD, 18: COINING MOLD, 19: PROTUBERANCE, 20 TO 22: LEADS, 23 TO 25: LEADS, 26 TO 28: PROTUBERANCES

DETAILED DESCRIPTION OF THE PREFERRED EMBODIMENTS

A first embodiment of the present invention will be subsequently described by reference to the drawings for comprehension of the present invention.

Figure 1:
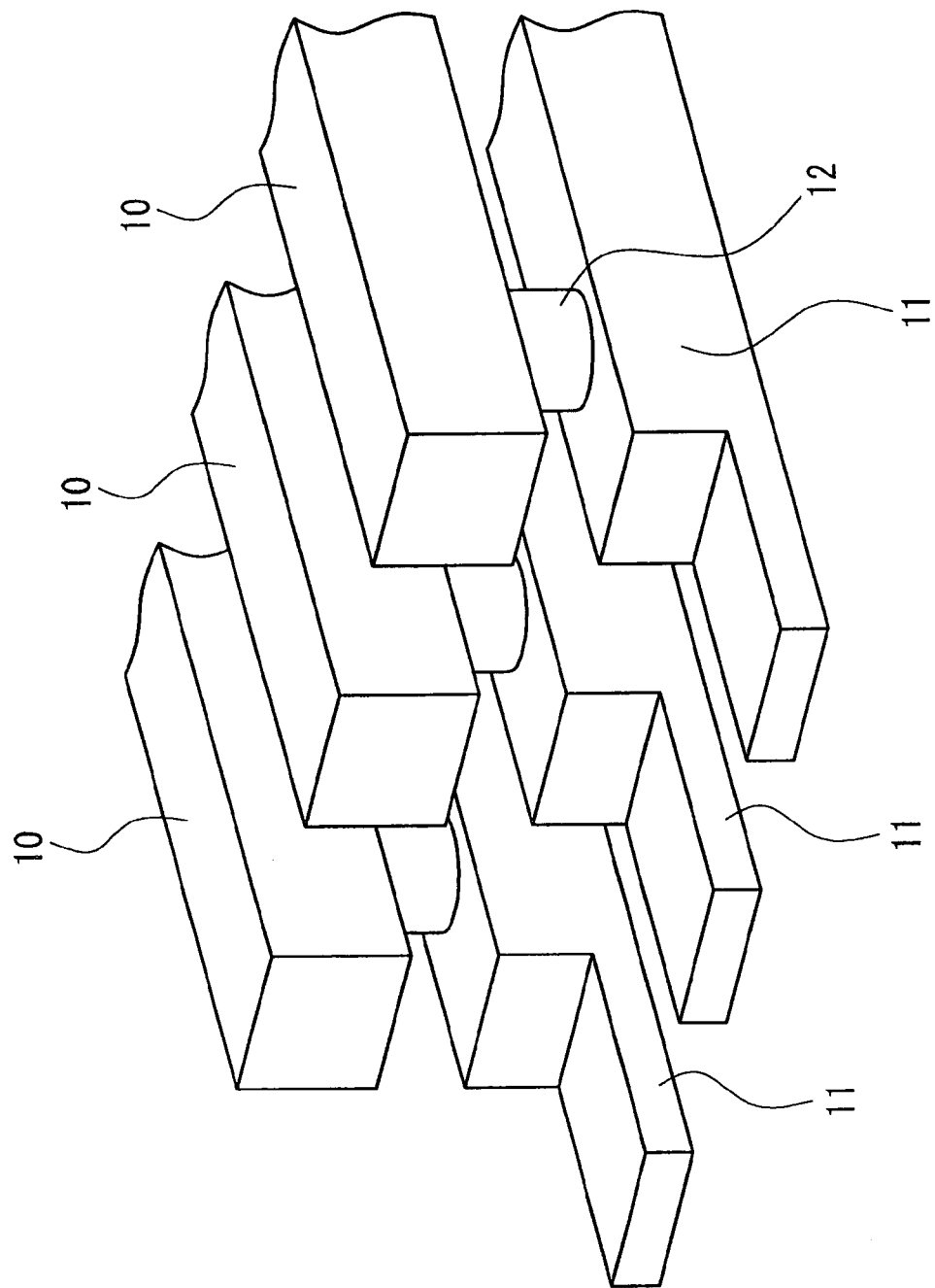
FIG. 1 is a perspective view of a laminated lead frame to which a method for manufacturing a laminated lead frame according to a first embodiment of the present invention is applied.
Figure 2:
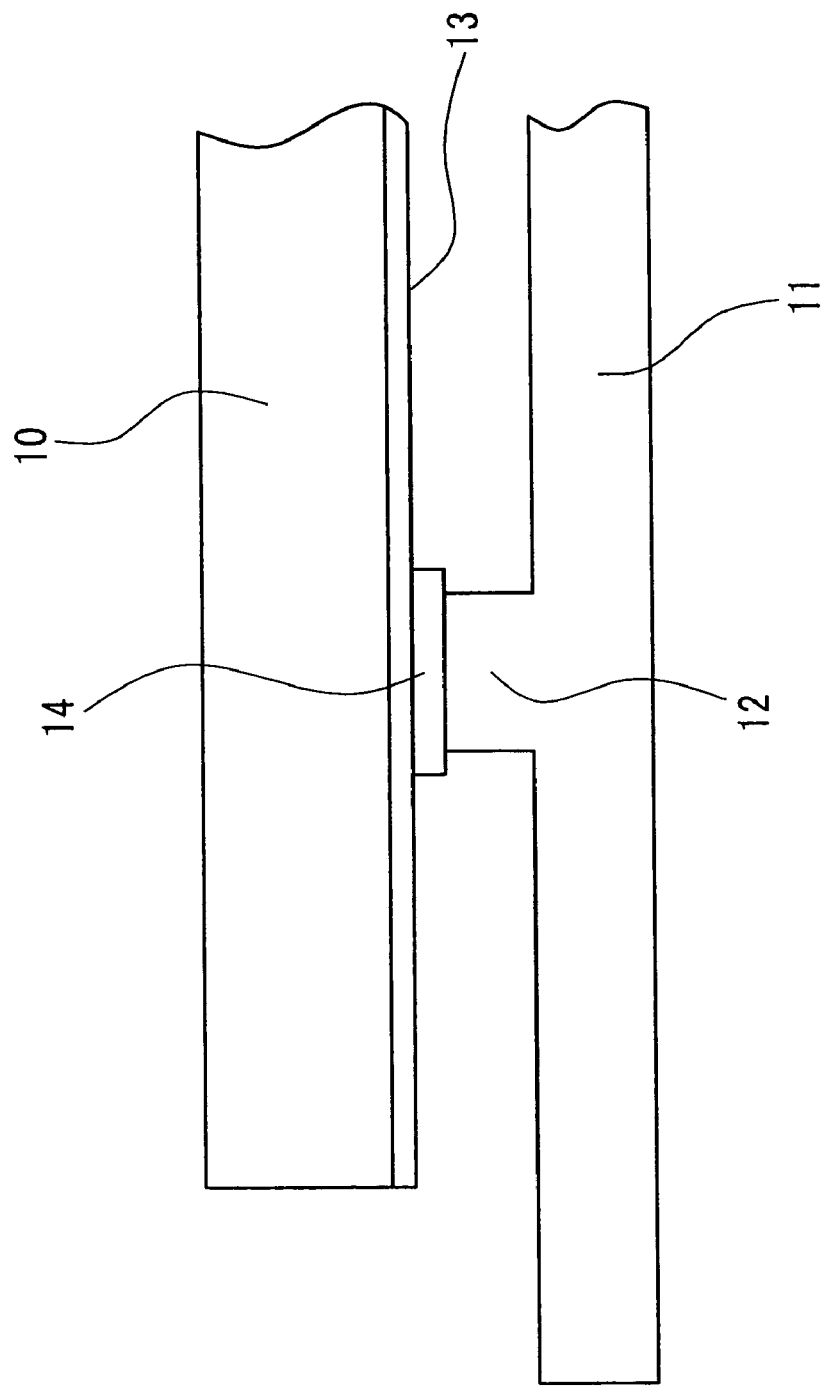
FIG. 2 is a descriptive view of the method.
Figure 3:
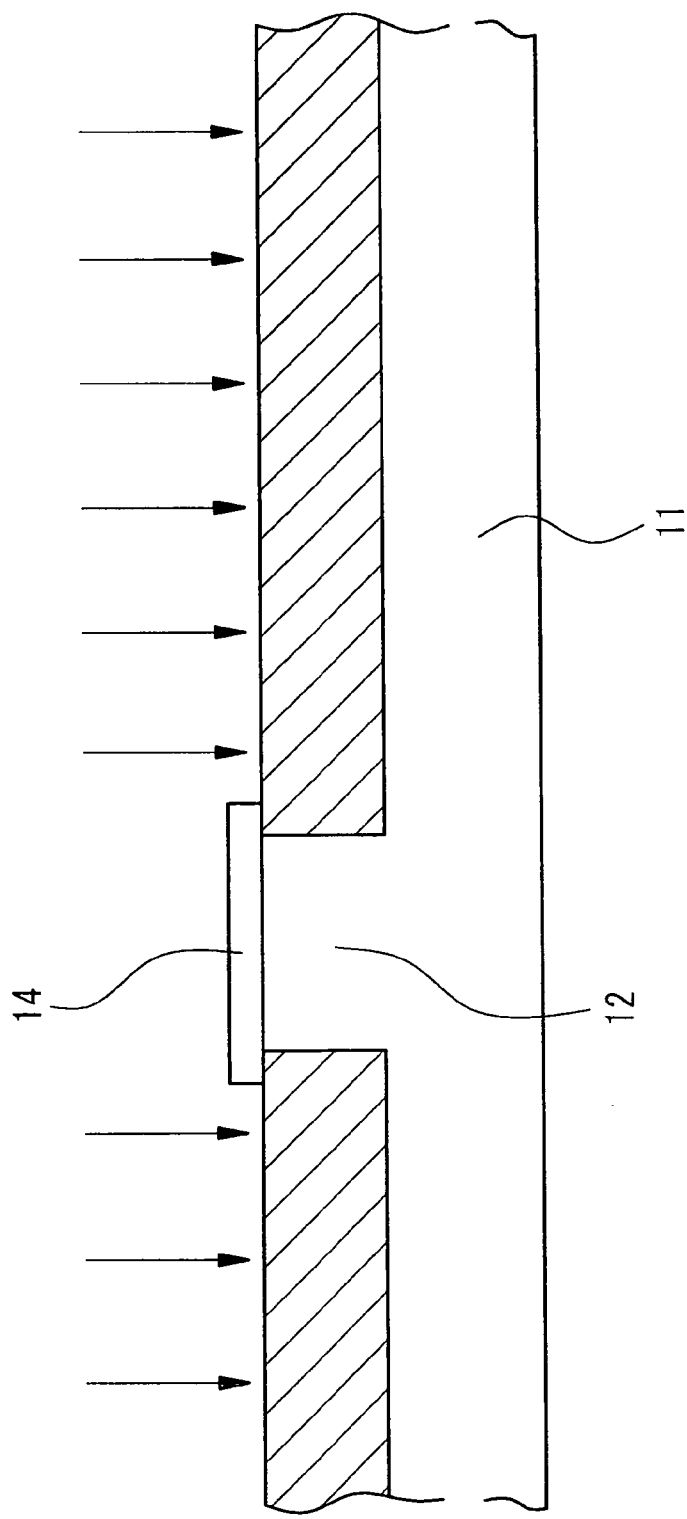
FIG. 3 is a descriptive view showing a method for creating protuberances.
Figure 4:
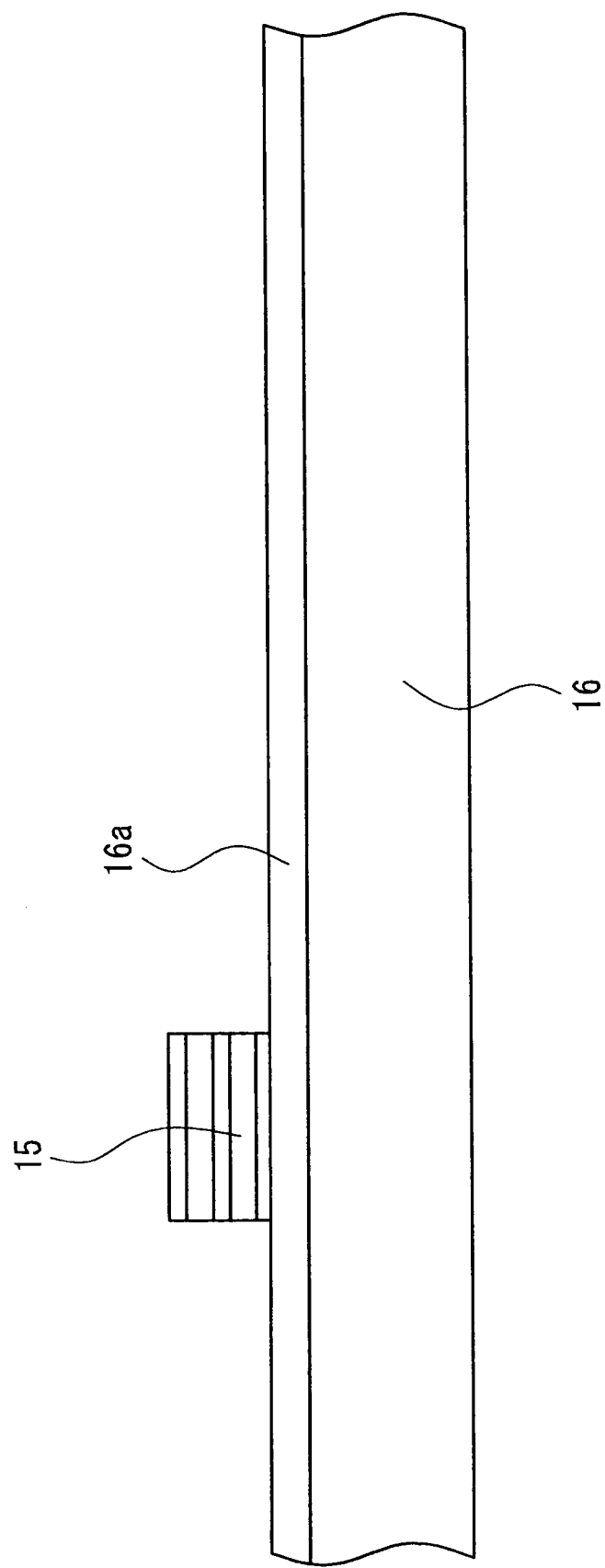
FIG. 4 is a descriptive view showing the method for creating protuberances.
Figure 5:
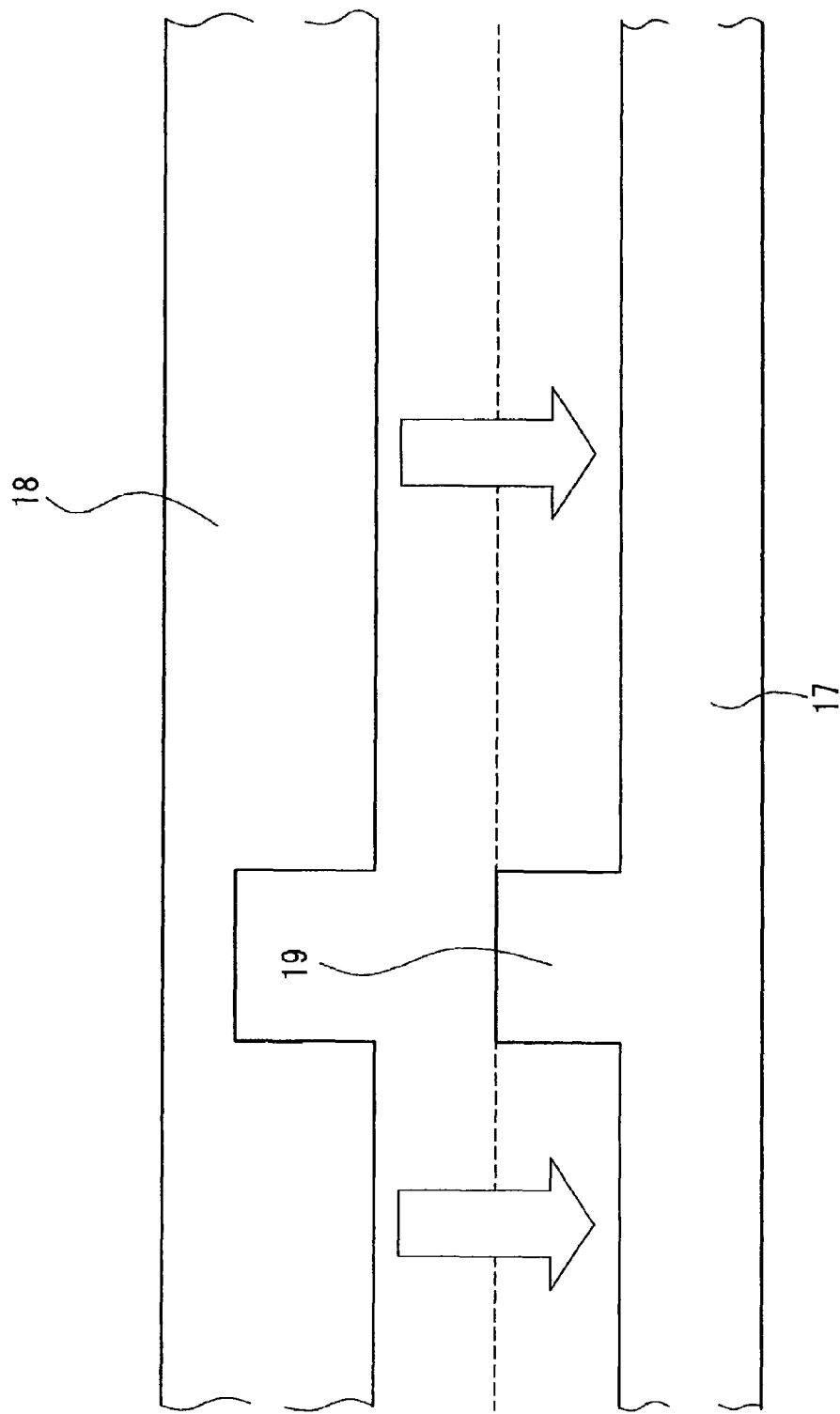
FIG. 5 is a descriptive view showing the method for creating protuberances.
Figure 6A:
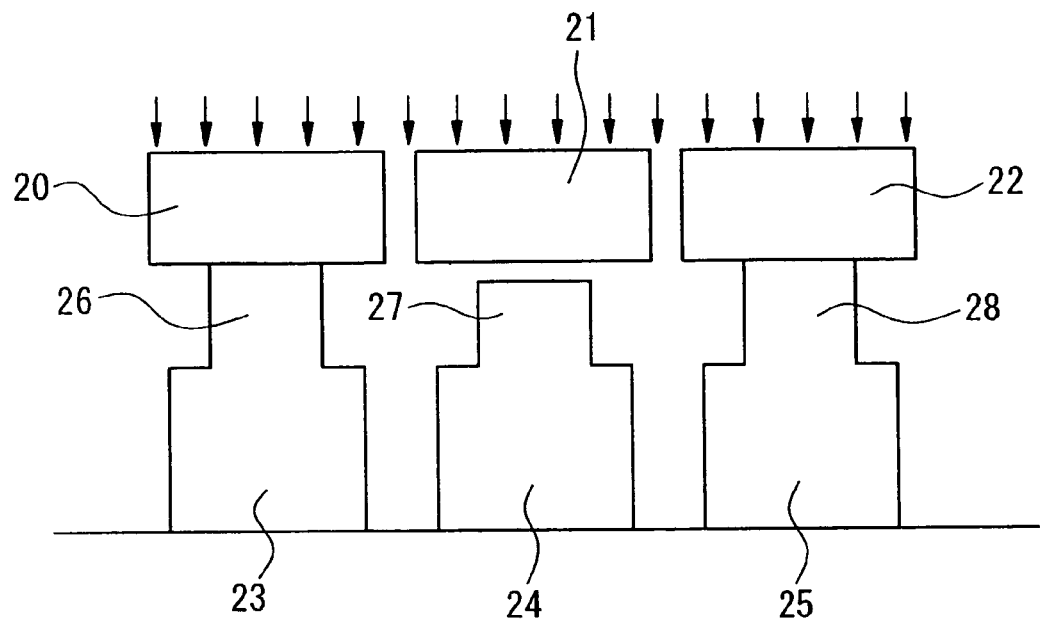
FIGS. 6A and 6B are descriptive views of the method.
Figure 6B:
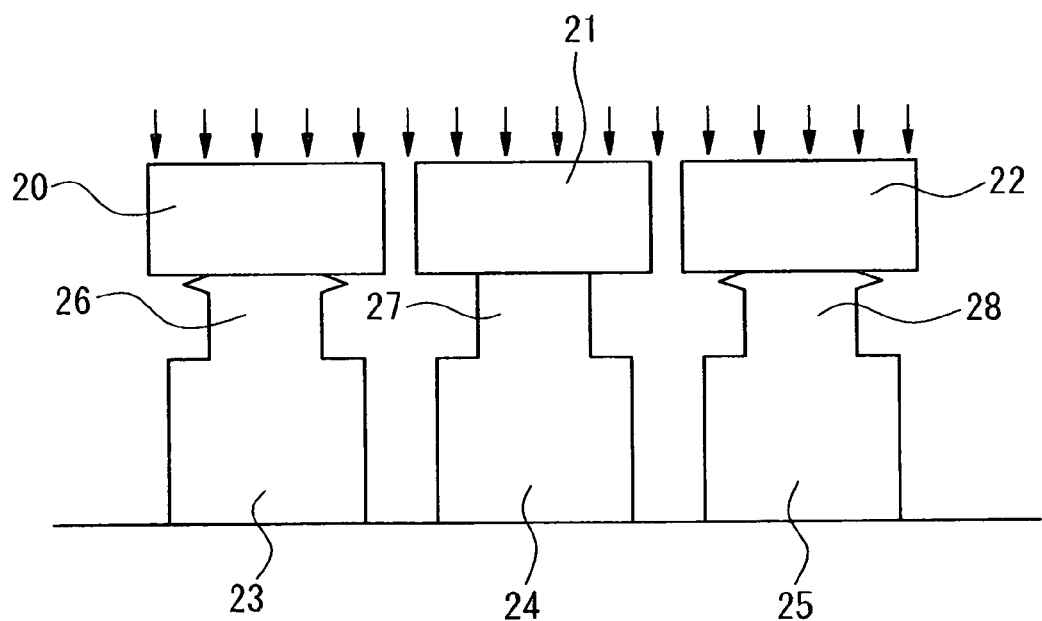

FIG. 1 is a perspective view of a laminated lead frame to which a laminated lead frame manufacturing method of the first embodiment of the present invention is applied; FIG. 2 is a descriptive view of the method; FIGS. 3 through 5 are descriptive views showing a method for creating protuberances; and FIGS. 6A and 6B are descriptive views of the method.

FIGS. 1 and 2 show a method for manufacturing a laminated lead frame according to the first embodiment of the present invention. Leads 10 forming portions of an upper lead frame single plate and leads 11 forming portions of a lower lead frame single plate are bonded together. A protuberance section 12 is created on each of upper surfaces of the lower leads 11.

Bottom surfaces (assuming a planar shape) of the upper leads 10 are coated with Ag-plating 13 which is an example of rare-metal plating, and upper surfaces of the protuberance sections 12 on the lower leads 11 are coated with Ag-plating 14 which is an example of rare-metal plating. Alternatively, the entire surfaces of the upper and lower leads 10, 11 are coated with Ag-plating.

A method for creating the protuberances 12 will be described by reference to FIGS. 3 through 5. Under the method shown in FIG. 3, the protuberance sections 12 are created by means of half-etching, wherein only areas on the extremities of the protuberance sections 12 are plated with Ag (rare metal) 14 which is not eroded by an etchant, and the thus-plated areas are brought into contact with the etchant. An extent to which the protuberances are subjected to half-etching (i.e., a depth of etching) is preferably one-quarter to four-fifths, or thereabouts, of the thickness of the original lead 11. The reasons for this are that the height of the protuberance sections 12 is reduced when the depth of half-etching is increased; that the cross-sectional area of a lead where an electric current flows is reduced as a result of the depth of half-etching being increased further; and that leads are broken or chipped by means of variations in etching. When the protuberance sections 12 are created through half-etching, the surfaces of the leads 11 as well as the surfaces of the protuberance sections 12 may also be plated with rare metal.

Under a method shown in FIG. 4, protuberance sections 15 are formed by means of multilayer plating (thick plating).

In this case, only the final layer is plated with rare metal; however, it may be the case that all of the layers are plated with rare metal. The height of the protuberances 15 may be one-fifth to two-thirds, or thereabouts, of the thickness of the lead 16 (a portion of the lead frame single plate). When the height of the protuberance sections 15 is small, deformation of the leads 16 cannot be addressed. In contrast, when the height of the protuberance sections 15 is great, a large number of plating operations are required, which adds to cost. Reference numeral 16a designates Ag-plating.

Under the method shown in FIG. 5, original leads 17 are pressed by a coining mold 18, to thus induce plastic deformation in the leads 17 and create protuberance sections 19. In this case, when an attempt is made to increase the height of the protuberance sections 19, a heavy load must be imparted to the leads 17, and the leads 17 become undesirably spread in the widthwise direction thereof and deformed.

Consequently, the sufficient height of the protuberance sections 19 is one-sixth to one-half (more preferably, one-sixth to one-third) of the thickness of the lead 17. The reason for this is that, since the surfaces of the leads 17 other than the protuberance sections 19 are made smooth by the coining mold 18, the top positions of extremities of the protuberance sections 19 can be maintained at a given level. When the protuberance sections 19 are formed by means of coining, the surfaces of the protuberance sections 19 are plated with rare metal.

Although the above-described protuberance sections 12, 15, and 19 are circular when viewed from the top, they may be square, oval, rectangular, or the like. The width (e.g., a diameter) of the protuberance sections 12, 15, and 19 is preferably one-tenth to third-tenths of the width of the leads 11, 16, and 17. When the width of the protuberance sections is too small, there may arise a case where an increase arises in conduction resistance between the leads and circuit resistance of a semiconductor device, thereby leading to problems.

FIGS. 6A and 6B show that leads 20 to 22 of the upper lead frame single element and leads 23 to 25 of a lower lead frame single element are diffusion bonded and thereby electrically connected by being pressed against each other while being heated at a controlled temperature in the range of 180° C. to 300° C.

As shown in FIG. 6A, when a protuberance section 27 of a lower center lead 24 is lower than protuberance sections 26 and 28 of the other leads 23 and 25 and when pressing force exerted on the leads 20 to 22 is small, the protuberance section 27 of the lower center lead 24 and the upper center lead 21 cannot be bonded together. In this case, as shown in FIG. 6B, when the pressing force exerted on the upper leads 20 to 22 is increased, the extremities of the protuberance sections 26 and 28 are collapsed, thereby enabling bonding of the protuberance section 27 with the lead 21. Consequently, in consideration of variations in the height of the protuberance sections 26 to 28 formed on the lower leads 23 to 25 (i.e., the lower lead frame single plate), the pressing force exerted on the upper leads 20 to 22 (i.e., the upper lead frame single plate) is controlled such that the protuberance sections 26 to 28 are collapsed by an amount corresponding to the variations. In this case, it is preferable that upper widths of the protuberance sections 26 to 28 are made small (to thus assume, e.g., a conical shape) so that the protuberance sections 26 to 28 are inevitably collapsed gradually from their extremities (which is possible in the case of coining).

The present invention is not limited to the previous embodiment and may be applied to a method which has been altered or modified without departing from the gist of the present invention. Particularly, for the sake of easy comprehension of the invention, the present embodiment has been described by use of specific numerals. However, the present invention is not limited to the scope and area defined by the numerals.

Moreover, in the present embodiment the protuberance sections are provided on the lower leads (i.e., the lead frame single plate). However, protuberance sections may also be provided on upper leads (i.e., a lead frame single plate).

A second embodiment of the present invention will now be described.

FIG. 7 is a perspective view which describes a method for manufacturing a laminated lead frame according to the second embodiment of the present invention, and FIGS. 8 to 13 are partially-detailed descriptive views of the same.

As shown in FIGS. 7 through 13, under the method for manufacturing a laminated lead frame according to the second embodiment of the present invention, the lead frame single plates 10 and 11 having undergone predetermined etching are prepared.

Figure 9:
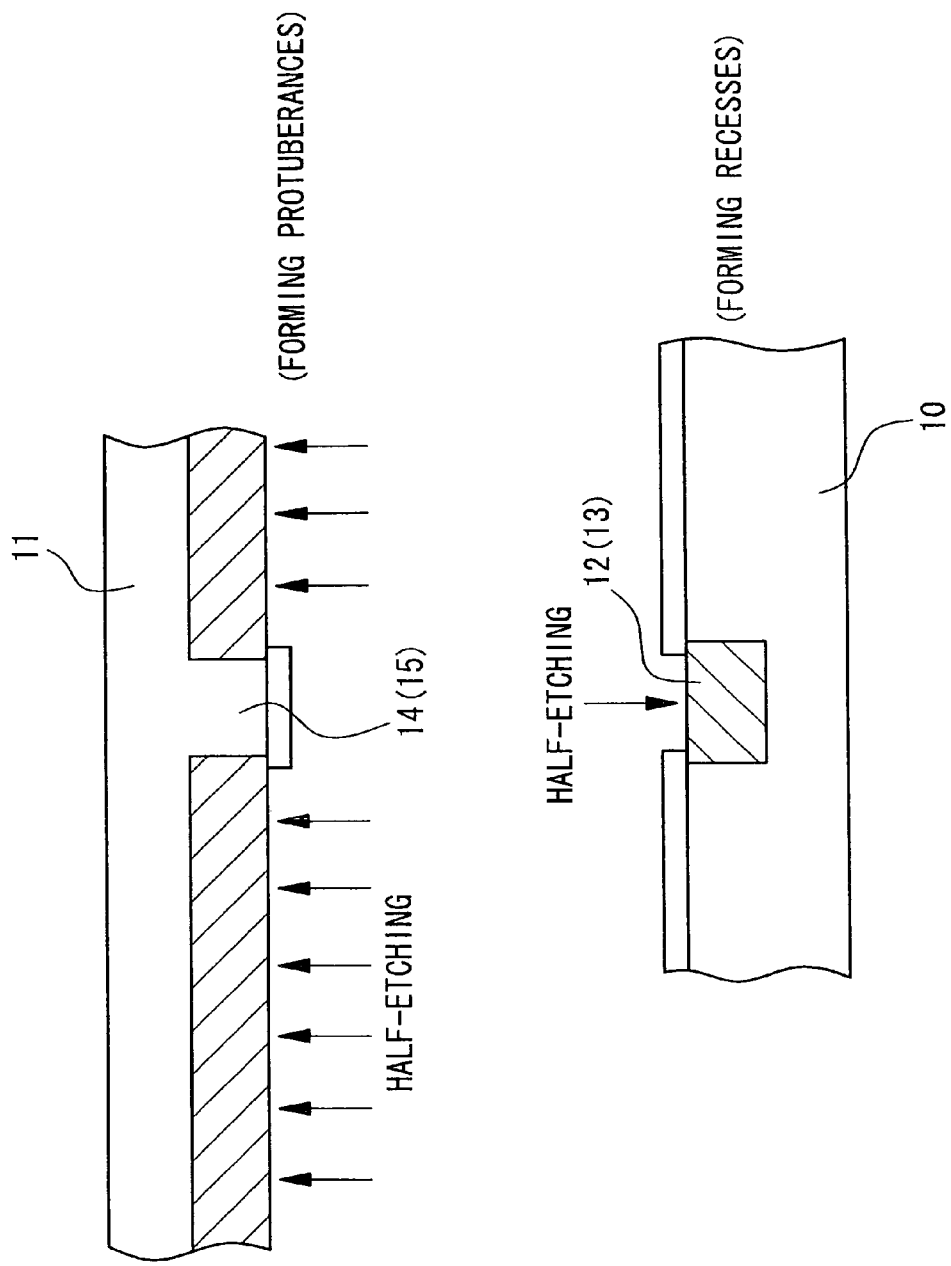
FIG. 9 is a partially-detailed descriptive view of the method.

In this case, the lead frame single plate 10 comes to a lower position, and the lead frame single plate 11 comes to an upper position. As shown in FIGS. 8 and 9, recess sections 12 and 13 are formed in respective ends of the lower lead frame single plate 10 by means of half-etching, and protuberance sections 14 and 15 are created at respective ends of the upper lead frame single plate 11 by means of half-etching. The lower and upper lead frame single plates 10 and 11 are provided at corresponding positions such that coincidence exists between the registration position of an upper lead frame pattern of the lower lead frame single plate 10 and the registration position of a lower lead frame pattern of the upper lead frame single plate 11 and such that the recess sections 12 and 13 and the protuberance sections 14 and 15, each of which assumes a circular cross-sectional profile, pair up with each other.

In the lead frame single plates 10 and 11 shown in FIG. 7, two sets of recesses and protuberances; namely, one set consisting of the recess section 12 and the protuberance section 14 and the other set consisting of the recess section 13 and the protuberance section 15, are formed not along the longitudinal side rails 16 and 17 but at intermediate positions of lateral side rails 16 and 17 at respective longitudinal ends of the lead frame single plates 10 and 11, each of which has three unit lead frames.

Figure 11:
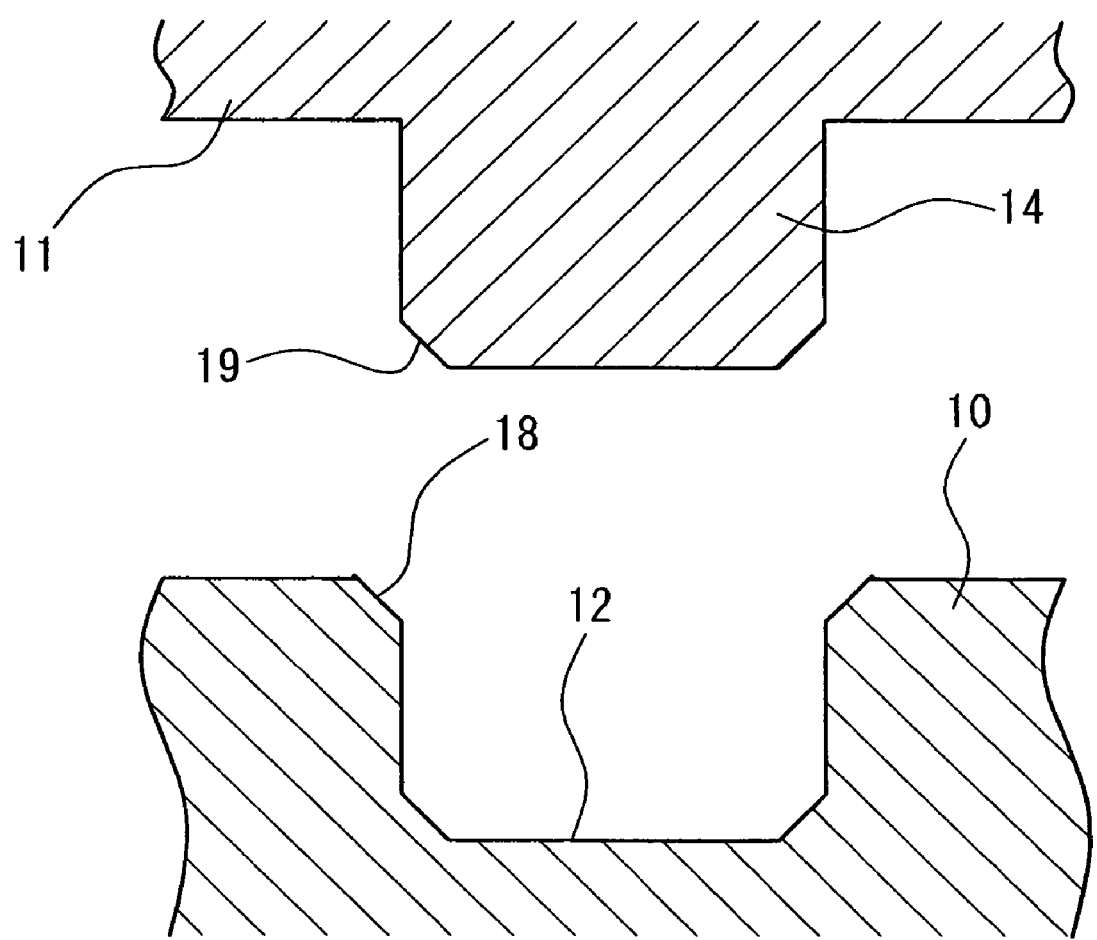
FIG. 11 is a partially-detailed descriptive view of the method.

FIG. 11 shows details of the recess section 12 and the protuberance section 14 (the same also applies to the recess section 13 and the protuberance section 15). Since these sections are formed by means of etching, an entrance side 18 of the recess section 12 is broadened, and an extremity 19 of the protuberance section 14 becomes smaller. As a result, fitting of the protuberance section 14 into the recess section 12 is facilitated.

The diameters of the principal sections of the protuberance section 14 and the recess section 12 vary according to the size of a laminated lead frame that is a product, but usually range from 0.2 to 2 mm or thereabouts. The diameter of the protuberance section 14 except the extremity thereof is larger than the diameter of the recess section 12 except the entrance portion within a nominal range (by an amount of e.g., one-fiftieth to one-five-hundredth of the diameter). When the protuberance section 14 has been fully fitted into the recess section 12, the protuberance section 14 is not readily removed.

The height of the protuberance section 14 and the depth of the recess section 12 range from, e.g., one-third to two-thirds of their respective thicknesses, and the height of the protuberance section 14 is smaller than the depth of the recess section 12.

Figure 10:
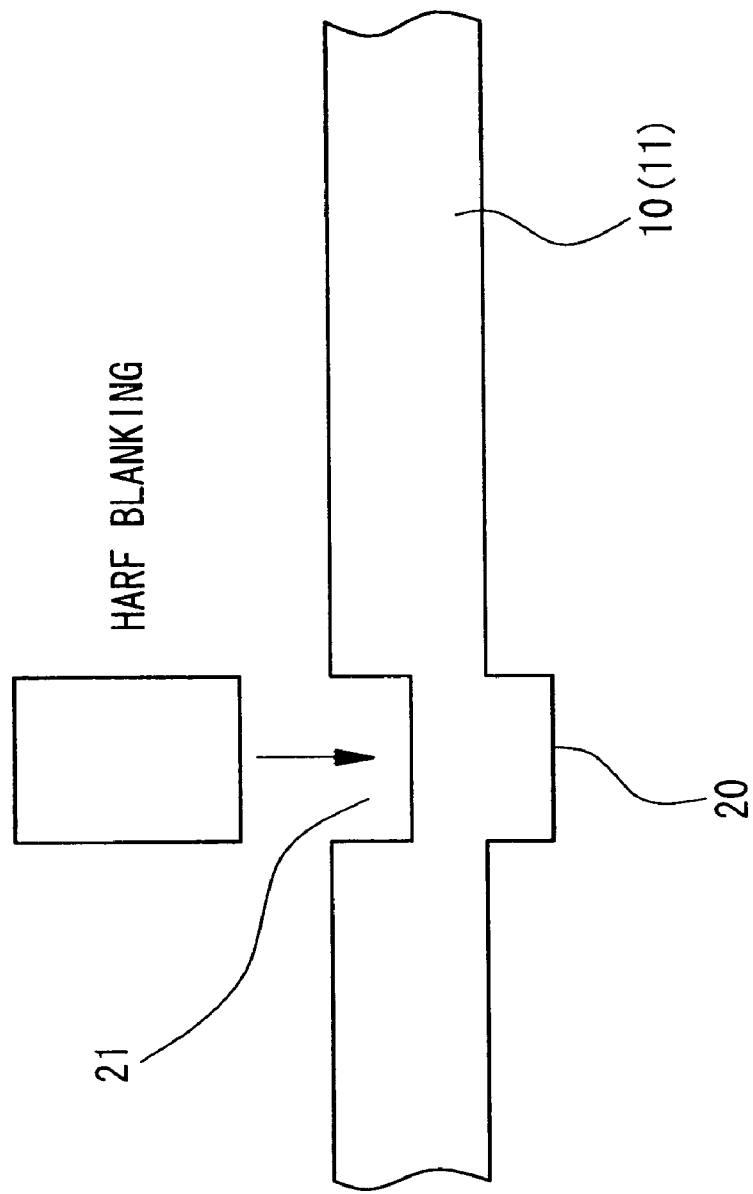
FIG. 10 is a partially-detailed descriptive view of the method.

In the present embodiment, the recess section 12 and the protuberance section 14 (the same also applies to the recess section 13 and the protuberance section 15) are formed by means of etching. As shown in FIG. 10, the sections can also be formed by means of half-blanking with use of a press machine. In this case, a protuberance section 20 is formed on the back surface of each of the lead frame single plates 10 and 11, and a recess section 21 is formed in the front surface of each of the lead frame single plates 10 and 11. Accordingly, when presence of the protuberance section 20 on the bottom of the lead frame single plate 10 to be disposed downstream creates a problem, a through hole may also be formed, in place of a half blank, in the lower lead frame single plate 10. Moreover, when a recess section 121 and the protuberance section 20 are formed by means of press working, the diameter of the entrance side of the recess section 21 can also be broadened, and the diameter of the extremity side of the protuberance 20 can also be made small. The depth of the recess section 21 is of the order of one-third to two-thirds, or thereabouts, of the thickness of the lead frame single plate.

Figure 12:
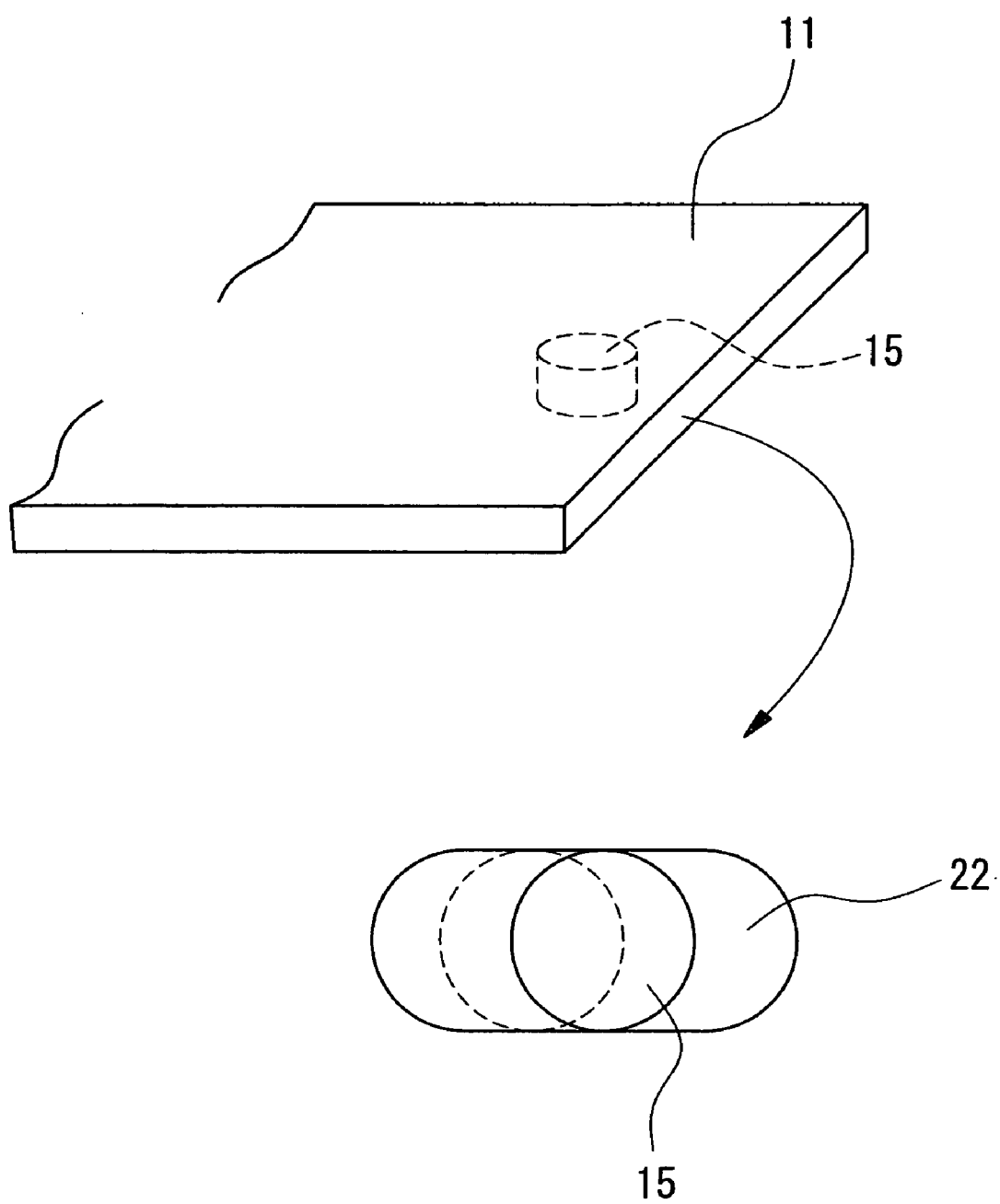
FIG. 12 is a partially-detailed descriptive view of the method.

As shown in FIG. 7, in the present embodiment, the recess section 12, the protuberance section 14, the recess section 13, and the protuberance section 15, each of which has a circular cross-sectional profile, are provided at respective ends of the lead frame single plates 10 and 11. Each of the recess section 12 and the protuberance section 14 of one set (i.e., for reference purpose) is formed so as to assume a circular cross-sectional profile, and the recess section 22 into which the other protuberance section 15 fits can also be formed into an elongated blind hole, as shown in FIG. 12.

As a result, even when a distance between the recess sections 12 and 22 may differ from a distance between the protuberance sections 14 and 15 for reasons of differences between the lower and upper lead frame single plates 10 and 11 in terms of thickness, material, the degree of machining, and the like, the protuberance section 15 having a circular cross-sectional profile (which may also be a rectangular cross-sectional profile) can be fit into the recess section 22. The recess section 22 is provided in the direction of maximum elongation of the lead frame single plate 10.

In order to absorb a difference in shape between the leads of the lead frame single plate 10 and the leads of the lead frame single plate 11, recess sections and protuberance sections for positioning purpose are provided in the center positions of the lateral sides of the lead frame single plates 10, 11 along the longitudinal direction thereof, and the recess sections among the recess sections and the protuberance sections provided on both sides of the recess and protuberance sections arranged at the center positions can also be formed into longitudinally-elongated holes.

The lead frame single plates 10 and 11 are subjected to diffusion bonding at elevated temperatures under pressure with the protuberance sections 14 and 15 being fit into the corresponding recess sections 12 and 13 in an intimately-contacting manner (e.g., a caulked manner). Therefore, the surfaces of the lead frame single plates 10 and 11—for which a copper material, a copper alloy material, and an iron alloy material have been separately etched or press-worked—are plated in advance with noble metal such as Au, Ag, or the like. After the lead frame single plates 10 and 11 have been superimposed one on top of the other, to thus create a laminated lead frame, the laminated lead frame undergoes respective processing operations, such as mounting of a semiconductor element, wire bonding, molding, marking, singulation separation, and the like, and finally is built into a semiconductor device.

Figure 13:
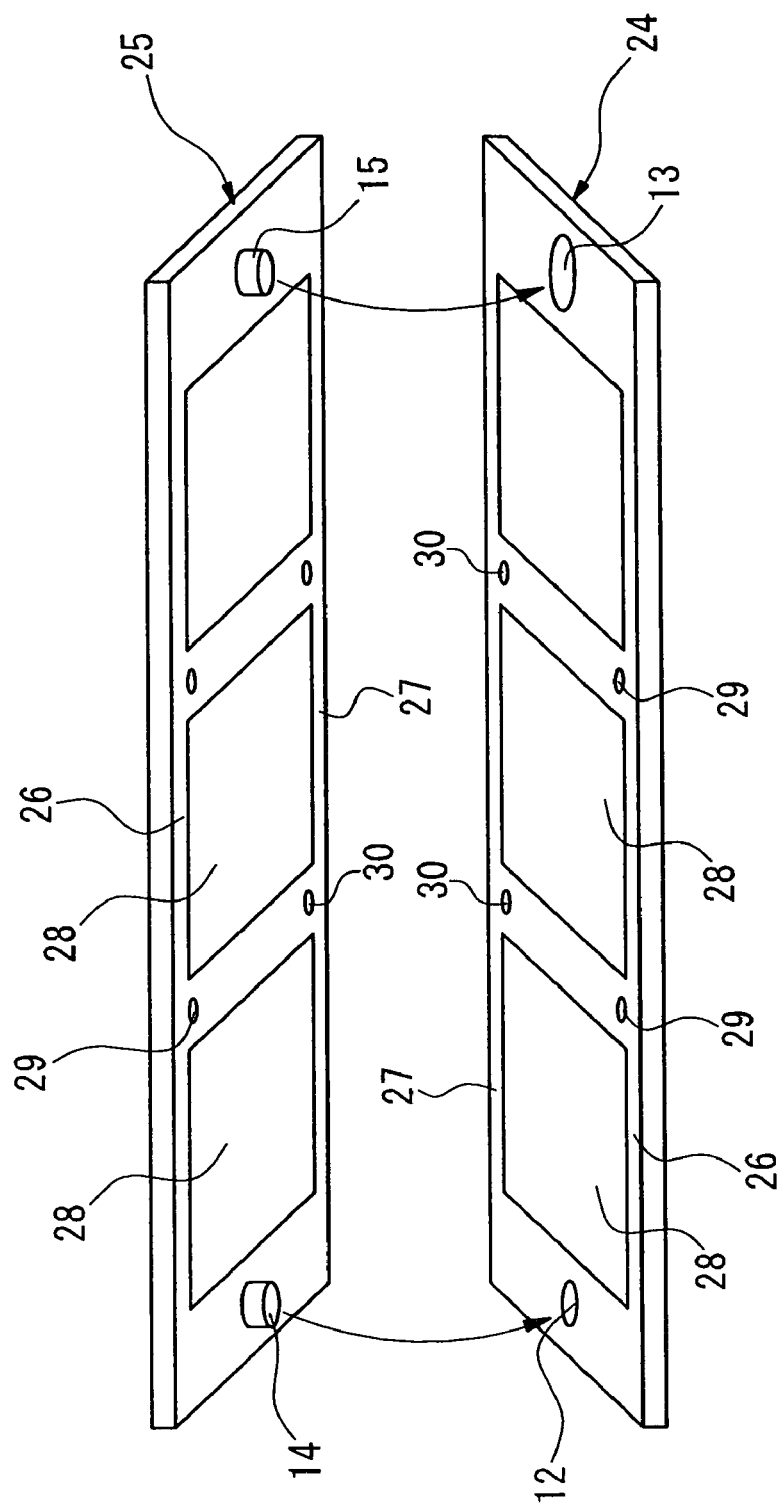
FIG. 13 is a perspective view for describing a method for manufacturing a laminated lead frame according to a third embodiment of the present invention.
Figure 14:
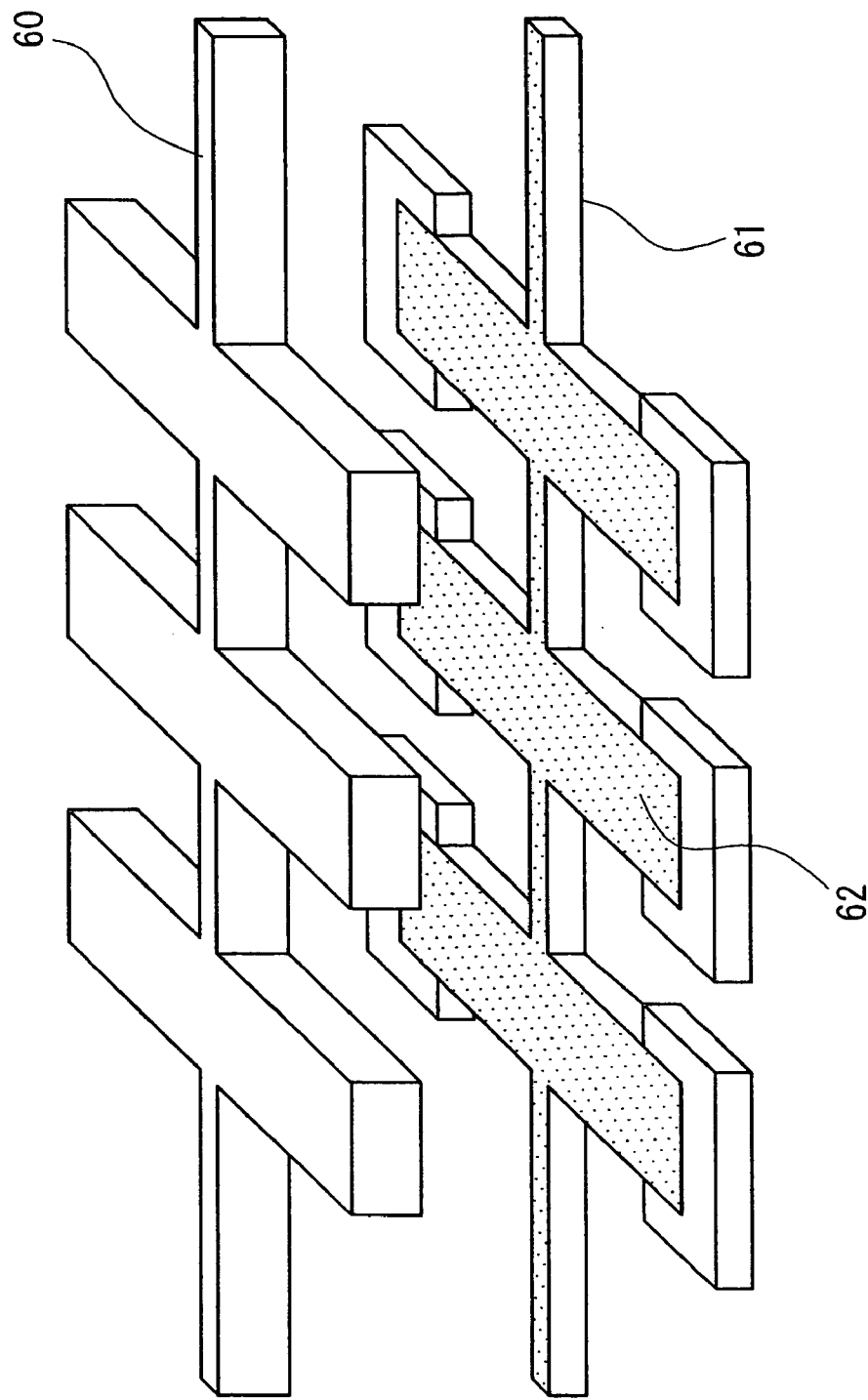
FIG. 14 is a descriptive view of a method for manufacturing a laminated lead frame of a related-art example.
Figure 15:
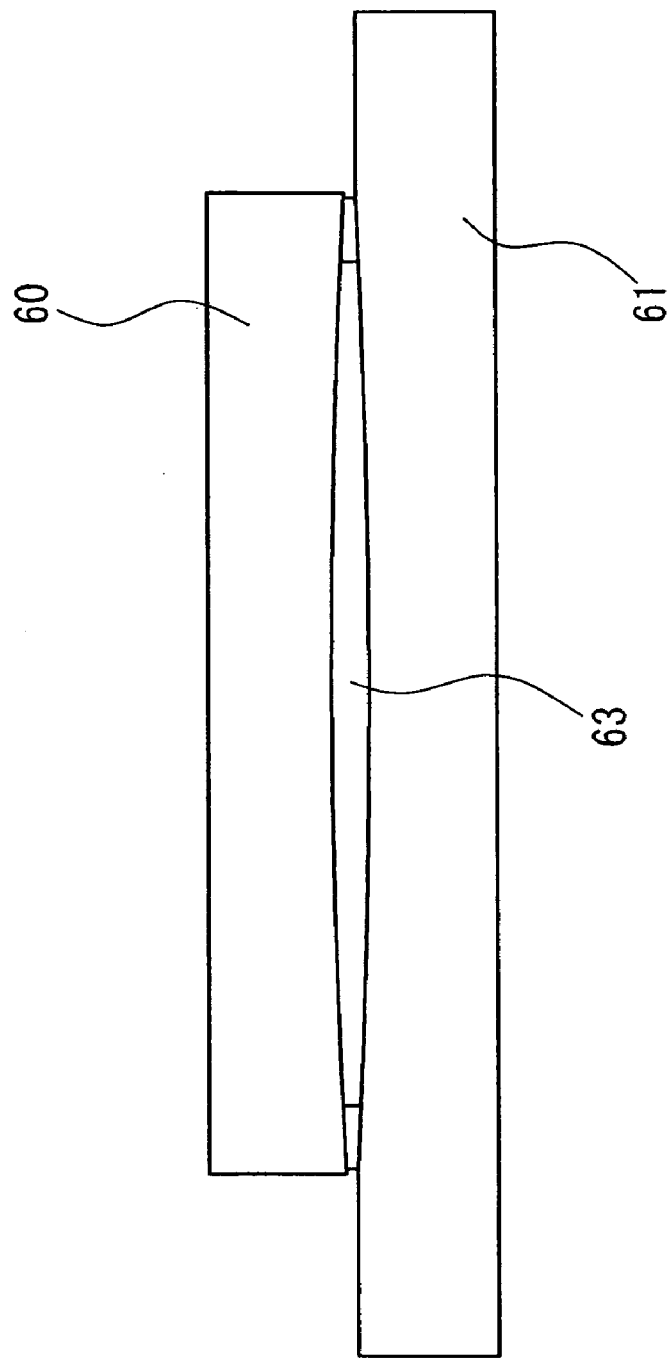
FIG. 15 is a descriptive view showing drawbacks of the method for manufacturing a laminated lead frame of the related-art example.

There will now be described a difference between a method for manufacturing a laminated lead frame according to a third embodiment of the present invention shown in FIG. 13 and the method for manufacturing a laminated lead frame of the first embodiment.

Under this method for manufacturing a laminated lead frame, pilot holes 29 and 30 are provided at positions which are inward of side rails 26 and 27 of lead frame single plates 24 and 25 and which are located between unit lead frames 28. By means of the pilot holes, lead frame single plates can be positioned readily in a material state thereof (e.g., determination of a position where masking is exposed during etching operation or positioning performed during press-working operation) during the course of manufacture of the lead frame single plates 24 and 25.

When the lower and upper lead frame single plates 24 and 25 are positioned by use of pilot pins, pins which are sufficiently smaller in diameter than the pilot holes 29 and 30 are used. As a result, a rattle arises between the pilot pins and the pilot holes, and fitting of the recess sections 12, 13 and the protuberance sections 14, 15 is performed smoothly. Preferably, the diameter of a pilot hole of a lead frame single plate to be placed on top is made greater than the diameter of a pilot hole of a lead frame single plate to be used for reference.

The pilot holes 29 and 30 are provided in the minimum-required number. When a laminated lead frame is transported by transport means such as a suction pad or the like, the pilot holes 29 and 30 are preferably provided in areas located among the respective unit lead frames 28 rather than in the side rails 26 and 27.

The present invention is not limited to the previously-described embodiments and can be subjected to modifications which do not depart from the scope of the gist of the present invention. Particularly, when the lead frame single plates 10 and 11 are not positioned by use of pilot holes, image processing operations and the outer shapes of the lead frame single plates 10 and 11 may also be made identical with each other, and the lead frame single plates 10 and 11 may also be positioned by means of a support member (in the form of an integrated member or a separated member) which is provided along a frame or surrounding so as to enclose the lead frame single plates 10 and 11.

Moreover, although in the present embodiment the number of lead frame single plates to be laminated is two, three or more lead frame single plates can also be laminated. For instance, when the present invention is applied to lead frame single plates which are vertically adjacent to each other, the present invention is naturally applied to a case where the lead frame single plates number three or more.

INDUSTRIAL APPLICABILITY

According to the method for manufacturing a laminated lead frame and the laminated lead frame, both of which pertain to the present invention, lead frame single plates to be superimposed one on top of the other are bonded together by use of protuberance sections. Therefore, as a result of a reduction in the area to be bonded, a load required for bonding can be diminished. As a result, working capability can be reduced and facilities can be miniaturized, and hence industrial applicability of the present invention is considerably high.

The present application is based upon and claims the benefit of priority of Japanese Patent Application No. 2005-327631 filed on Nov. 11, 2005 and Japanese Patent Application No. 2005-331937 filed on Nov. 16, 2005, the contents of which are incorporated herein by reference in their entireties.

What is claimed is:

1. A method for manufacturing a laminated lead frame from a plurality of lead frame single plates, each of which is processed into a predetermined shape, the method comprising:
    forming a plurality of protuberances in at least one of mutually-opposing faces of upper and lower lead frame single plates forming a pair by any one of half-etching, coining, and thick plating;
    stacking the upper and lower lead frame single plates such that the protuberances are interposed between the upper and lower lead frame single plates; and
    diffusion bonding protruberances on one of the upper and lower lead frame single plates with areas on the other of the upper and lower lead frame single plates to thereby effect electrical connection by application of pressure between the protuberances and areas with the protruberances and areas heated to a controlled temperature.

2. A method for stacking and bonding together a plurality of lead frame single plates, each of which is processed into a predetermined shape, the method comprising:
    forming a plurality of protuberances in one of mutually-opposing faces of upper and lower lead frame single plates forming a pair by any one of half-etching, coining, and thick plating;
    situating the upper and lower lead frame single plates such that the protuberances are interposed between the upper and lower lead frame single plates; and
    diffusion bonding protruberances on one of the upper and lower lead frame single plates with areas on the other of the upper and lower lead frame single plates to thereby effect electrical connection by application of pressure between the protuberances and areas with the protruberances and areas heated to a controlled temperature.

3. The method for stacking and bonding lead frame single plates according to claim 2, wherein surfaces of the protuberances and which are brought into contact with the surfaces of the protuberances are plated with rare metal.

4. The method for stacking and bonding lead frame single plates according to claim 3, wherein the step of diffusion bonding is performed by application of pressure adequate to collapse extremities of the protuberances, while the lead frame single plates are heated at 180° C. to 300° C.

5. The method for stacking and bonding lead frame single plates according to claim 2, wherein the step of diffusion bonding the lead frame single plates comprises bonding the lead frame single plates only at the protuberances.

6. The method for manufacturing a laminated lead frame according to claim 1, wherein the step of stacking the lead frame single plates comprises stacking the lead frame single plates so that a plurality of protuberances on one of the upper and lower lead frame single plates abut to the other of the upper and lower lead frame single plates at locations where there are no protuberances on the other of the upper and lower lead frame single plates.

7. The method for stacking and bonding lead frame single plates according to claim 2, wherein the step of diffusion bonding the lead frame single plates comprises bonding the lead frame single plates so that a plurality of protuberances on one of the upper and lower lead frame single plates abut to the other of the upper and lower lead frame single plates at locations where there are no protuberances on the other of the upper and lower lead frame single plates.

8. A method for manufacturing a laminated lead frame by stacking together a plurality of lead frame single plates, each of which is processed into a predetermined shape, the method comprising:
    forming a plurality of solid, non-hollow, protuberances on at least one of mutually-opposing faces of upper and lower lead frame single plates forming a pair;
    stacking the upper and lower lead frame single plates such that the protuberances are interposed between the upper and lower lead frame single plates; and
    diffusion bonding the protruberances on one of the upper and lower lead frame single plates to the other of the upper and lower lead frame single plates by applying pressure between the upper and lower lead frame single plates with the upper and lower lead frame single plates heated to a controlled temperature,
    the plurality of protruberances non-hollow with the protruberances bonded to the other of the upper and lower lead frame single plates.

* * * * *